US009425810B2

(12) United States Patent
Ma et al.

(10) Patent No.: US 9,425,810 B2
(45) Date of Patent: Aug. 23, 2016

(54) FREQUENCY SIGNAL GENERATING SYSTEM AND DISPLAY DEVICE

(71) Applicants: BOE Technology Group Co., Ltd., Beijing (CN); Beijing BOE Display Technology Co., Ltd., Beijing (CN)

(72) Inventors: Xitong Ma, Beijing (CN); Xiao Zhang, Beijing (CN); Shuhuan Yu, Beijing (CN); Lijie Zhang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/361,405

(22) PCT Filed: Dec. 20, 2013

(86) PCT No.: PCT/CN2013/090069
§ 371 (c)(1),
(2) Date: May 29, 2014

(87) PCT Pub. No.: WO2015/010432
PCT Pub. Date: Jan. 29, 2015

(65) Prior Publication Data
US 2015/0236708 A1 Aug. 20, 2015

(30) Foreign Application Priority Data

Jul. 25, 2013 (CN) .......................... 2013 1 0316999

(51) Int. Cl.
| H03L 7/06 | (2006.01) |
| H03L 7/18 | (2006.01) |
| H03L 7/099 | (2006.01) |

(52) U.S. Cl.
CPC ............... *H03L 7/18* (2013.01); *H03L 7/0992* (2013.01)

(58) Field of Classification Search
USPC .................................. 327/147–149, 156–158
See application file for complete search history.

(56) References Cited

U.S. PATENT DOCUMENTS

| 4,975,930 A | * | 12/1990 | Shaw | .................... H04L 7/0331 327/156 |
| 5,168,245 A | * | 12/1992 | Koskowich | ............... H03L 7/10 331/1 A |

(Continued)

FOREIGN PATENT DOCUMENTS

| CN | 101136631 A | 3/2008 |
| CN | 101854171 A | 10/2010 |

(Continued)

OTHER PUBLICATIONS

English translation of PCT Written Opinion of the International Searching Authority (SIPO is the ISA) for international application PCT/CN2013/090069 mailed Mar. 27, 2014.

(Continued)

*Primary Examiner* — Adam Houston
(74) *Attorney, Agent, or Firm* — Frommer Lawrence & Haug LLP

(57) ABSTRACT

A frequency signal generating system comprises a digital phase-locked loop for receiving a source frequency signal; a loop filter for filtering out high frequency components of a signal output from the digital phase-locked loop; and a voltage controlled oscillator for outputting a target frequency signal according to a signal from the loop filter, wherein an output terminal of the voltage controlled oscillator is connected to a first output terminal of the digital phase-locked loop so that the target frequency signal output from the voltage controlled oscillator is fed back to the digital phase-locked loop, the digital phase-locked loop performs frequency-dividing and phase-detecting on the source frequency signal and the fed back target frequency signal so that the target frequency signal output from the voltage controlled oscillator and the source frequency signal satisfy a definite mathematical relationship therebetween.

17 Claims, 5 Drawing Sheets

(56) References Cited

U.S. PATENT DOCUMENTS

| | | | |
|---|---|---|---|
| 8,836,389 B2* | 9/2014 | Vandepas | H03L 1/022 327/147 |
| 2003/0076176 A1 | 4/2003 | Fischer | |
| 2004/0151271 A1 | 8/2004 | Krueger et al. | |
| 2008/0048791 A1* | 2/2008 | Fahim | H03L 7/085 331/1 A |
| 2009/0256601 A1* | 10/2009 | Zhang | H03L 7/085 327/156 |
| 2010/0123492 A1* | 5/2010 | Atsumi | H03L 7/093 327/156 |
| 2011/0007859 A1* | 1/2011 | Ueda | H03L 7/0802 375/376 |
| 2012/0092053 A1* | 4/2012 | Narathong | H03L 7/091 327/159 |
| 2012/0313676 A1* | 12/2012 | Nguyen | H03L 7/23 327/156 |
| 2013/0147529 A1* | 6/2013 | Ganesan | H03L 7/1803 327/156 |
| 2013/0234800 A1* | 9/2013 | Lee | H03L 7/06 331/1 A |
| 2014/0225635 A1* | 8/2014 | Dasnurkar | G01R 31/31726 324/750.3 |
| 2014/0333358 A1* | 11/2014 | Kim | H03L 7/1974 327/159 |
| 2015/0236708 A1* | 8/2015 | Ma | H03L 7/0992 327/156 |

FOREIGN PATENT DOCUMENTS

| | | |
|---|---|---|
| CN | 201601665 U | 10/2010 |
| CN | 102447475 A | 5/2012 |
| CN | 103427836 A | 12/2013 |

OTHER PUBLICATIONS

Notification of the First Office Action from SIPO for priority Chinese application 201310316999.6 issued Aug. 4, 2015 with English translation.

First office action from KIPO for corresponding Korean application No. 10-2014-7014833 dated Jul. 30, 2015.

Notice of Rejection from Korean Intellectual Property Office for corresponding Korean application 10-2014-7014833 mailed Feb. 25, 2016 with English translation.

Second office action from Chinese Patent Office for priority Chinese application 201310316999.6 mailed Mar. 18, 2016.

* cited by examiner

FREQUENCY SIGNAL GENERATING SYSTEM AND DISPLAY DEVICE

This application is a 371 of PCT/CN2013/090069 filed on Dec. 20, 2013, which claims priority benefits from Chinese Patent Application Number 201310316999.6 filed Jul. 25, 2013, the disclosure of which is incorporated herein by reference.

FIELD OF THE INVENTION

The invention relates to the field of display technology, in particular, to a frequency signal generating system and a display device.

BACKGROUND OF THE INVENTION

Frequency signals include various signals in different bands, such as high-frequency signals, intermediate-frequency signals, and low-frequency signals. Frequency signals are widely applied in the field of display technology, such as, a high-frequency signal is typically used as a clock signal, a calibration signal or a carrier signal, and a low-frequency signal is typically used as a test signal.

The frequency signal is so widely used, and a variety of different frequency signals are generated by different signal generating devices or systems, whereby various signal generating devices or systems, each of which has a certain performance and specification, occur. Currently, a frequency signal can be generated by adopting an analog device or in digital synthesis device.

An analog device is typically a circuit composed of discrete components such as a transistor, a resistor, a capacitor, etc., the frequency signal generated by the analog devices is not high in stability, difficult to debug, and can not accurately control the frequency step. The digital synthesis device is typically a circuit composed of a frequency control word register, a phase accumulator, a sine lookup table, a digital/analog converter, and a programmable logic device such as a direct digital frequency synthesizer (DDS) chip or a field programmable gate array (FPGA), the digital synthesis device can generate frequency signals with arbitrary waveforms and more precise step frequency, and the stability of the generated frequency signal is relatively high, but the digital synthesis device is expensive.

Therefore, how to design a frequency signal generating system which is low in cost and can generate precisely controllable and stable frequency signals becomes a technical problem to be solved currently.

SUMMARY OF THE INVENTION

To solve the above problem in the prior art, the invention provides a frequency signal generating system and a display device. The frequency signal generating system is a closed-loop system composed of analog circuits and digital circuits, the frequency signal generating system can generate a variety of target frequency signals which can be precisely controlled, and the system uses a negative feedback circuit to improve the stability of the system; while the combination of the analog and digital circuits greatly reduces the cost of the frequency signal generating system.

The invention provides a frequency signal generating system comprising: a digital phase-locked loop for receiving a source frequency signal; a loop filter, an input terminal of which is connected to an output terminal of the digital phase-locked loop, for filtering out high frequency components of a signal output from the digital phase-locked loop; and a voltage controlled oscillator, an input terminal of which is connected to an output terminal of the loop filter, for outputting a target frequency signal according to a signal from the loop filter, wherein an output terminal of the voltage controlled oscillator is connected to a first input terminal of the digital phase-locked loop so that the target frequency signal output from the voltage controlled oscillator is fed back to the digital phase-locked loop, the digital phase-locked loop performs frequency-dividing and phase-detecting on the source frequency signal and the fed back target frequency signal so that the target frequency signal output from the voltage controlled oscillator and the source frequency signal satisfy a definite mathematical relationship therebetween.

Preferably, the frequency signal generating system further comprises a crystal oscillator, an output terminal of which is connected to a second input terminal of the digital phase-locked loop, for outputting the source frequency signal.

Preferably, the frequency signal generating system further comprises a frequency divider connected between the output terminal of the voltage controlled oscillator and the first input terminal of the digital phase-locked loop, for performing frequency-dividing on the fed back target frequency signal and supplying the frequency-divided target frequency signal to the digital phase-locked loop.

Preferably, the digital phase-locked loop comprises a reference counter, a first frequency-dividing counter and a phase detector.

an input terminal of the reference counter receives the source frequency signal, an input terminal of the first frequency-dividing counter is connected to an output terminal of the frequency divider, an output terminal of the reference counter is connected to a first input terminal of the phase detector, an output terminal of the first frequency-dividing counter is connected to a second input terminal of the phase detector, and an output terminal of the phase detector is connected to the input terminal of the loop filter;

the reference counter performs frequency-dividing on the source frequency signal and outputs the frequency-divided source frequency signals to the phase detector;

the frequency-divided target frequency signal received from the frequency divider is frequency-divided again by the first frequency-dividing counter and output to the phase detector;

the phase detector compares the frequency-divided source frequency signal and the frequency-divided target frequency signal, generates an error voltage signal, and outputs the error voltage signal to the loop filter, the error voltage signal is converted into a DC voltage signal after its high frequency components are filtered out by the loop filter, the DC voltage signal is output to the voltage controlled oscillator, and the voltage controlled oscillator outputs the target frequency signal according to the DC voltage signal.

Preferably, the frequency division ratio of the frequency divider is P, the first frequency-dividing counter comprises a divide-by-N counter whose frequency division ratio is N, the total frequency division ratio of the frequency divider and the divide-by-N counter is NT=P×N; the definite mathematical relationship between the target frequency signal and the source frequency signal is: $F_{vco}=[(P\times N)]F_{osc}/R$, wherein $F_{vco}$ represents a frequency of the target frequency signal, $F_{osc}$ represents a frequency of the source frequency signal, and R represents a frequency division ratio of the reference counter.

Preferably, the digital phase-locked loop further comprises a second frequency-dividing counter, an input terminal of the second frequency-dividing counter is connected to the output terminal of the frequency divider, an output terminal of the second frequency-dividing counter is connected to a control input terminal of the frequency divider, the second frequency-dividing counter supplies a frequency-dividing control signal to the frequency divider such that the frequency divider adopts different frequency-dividing modes according to the frequency-dividing control signal.

Preferably, the frequency divider is a dual-mode frequency divider, the frequency division ratio of the dual-mode frequency divider is P/P+1, the first frequency-dividing counter is a divide-by-N counter whose frequency division ratio is N, the second frequency-dividing counter is a divide-by-A counter whose frequency division ratio is A, the total frequency division ratio of the dual-mode frequency divider, the divide-by-N counter and the divide-by-A counter is NT=P×N+A; the definite mathematical relationship between the target frequency signal and the source frequency signal is: Fvo=[(P×N)+A]Fosc/R, wherein Fvco represents a frequency of the target frequency signal, Fosc represents a frequency of the source frequency signal, and R represents a frequency division ratio of the reference counter.

Preferably, the digital phase-locked loop comprises a reference counter, a first frequency-dividing counter and a phase detector, an input terminal of the reference counter receives the source frequency signal, an input terminal of the first frequency-dividing counter is connected to an output terminal of the voltage controlled oscillator, an output terminal of the reference counter is connected to a first input terminal of the phase detector, an output terminal of the first frequency-dividing counter is connected to a second input terminal of the phase detector, and an output terminal of the phase detector is connected to the input terminal of the loop filter;

the reference counter performs frequency-dividing on the source frequency signal and then outputs the frequency-divided source frequency signal to the phase detector;

the first frequency-dividing counter performs frequency-dividing on the target frequency signal and then outputs the frequency-divided target frequency signal to the phase detector;

the phase detector compares the frequency-divided source frequency signal and the frequency-divided target frequency signal, generates an error voltage signal, and outputs the error voltage signal to the loop filter, the error voltage signal is converted into a DC voltage signal after its high frequency components are filtered out by the loop filter, the DC voltage signal is output to the voltage controlled oscillator, and the voltage controlled oscillator outputs the target frequency signal according to the DC voltage signal.

Preferably, the first frequency-dividing counter is a divide-by-N counter whose frequency division ratio is N, and the definite mathematical relationship between the target frequency signal and the source frequency signal is: Fvco=NFosc/R, wherein Fvco represents a frequency of the target frequency signal, Pose represents a frequency of the source frequency signal, and R represents a frequency division ratio of the reference counter.

Preferably, the voltage controlled oscillator comprises a voltage-capacitance conversion device for converting the DC voltage signal into the target frequency signal.

Preferably, the frequency divider is a digital frequency divider, the digital frequency divider is configured by a monolithic integrated frequency synthesizer chip, and the loop filter is an analog low-pass filter.

Preferably, the frequency signal generating system further comprises a human-computer interface including a single-chip microcomputer, wherein the human-computer interface includes a keypad which is connected to a digital parameter input terminal of the single-chip microcomputer, a digital parameter output terminal of the single-chip microcomputer is connected to a third input terminal of the digital phase-locked loop and frequency-dividing parameter values for the reference counter, the first frequency-dividing counter or the second frequency-dividing counter in the digital phase-locked loop are preset through the keypad; and/or the human-computer interface further includes a signal processor and a display, an input terminal of the signal processor is connected to the output terminal of the voltage controlled oscillator, an output terminal of the signal processor is connected to a frequency input terminal of the single-chip microcomputer, the output terminal of the signal processor is connected to the frequency input terminal of the single-chip microcomputer, the display is connected to a display data output terminal of the single-chip microcomputer, and the signal processor is used to process the target frequency signal so that the display displays the target frequency.

The invention also provides a display device comprising the above frequency signal generating system.

Beneficial effects of the invention are as follows: the frequency signal generating system provided by the invention is a closed-loop system composed of analog circuits and digital circuits. The frequency signal generating system can generate a variety of target frequency signals which can be accurately controlled, and the stability of the frequency signal generating system is improved through the negative feedback circuit; the keypad and the display constitute a human-computer interface under the control of the single-chip microcomputer such that it is easy to monitor the control; the combination of the analog circuits and the digital circuits largely reduces the cost of the frequency signal generating system. As the display device in the invention adopts the frequency signal generating system, thus a carrier frequency signal, which can be accurately controlled, can be obtained, and the display cost of the display device is reduced.

DETAILED DESCRIPTION OF THE EMBODIMENTS

In order to make the person skilled in the art to understand the solutions of the invention better, the frequency signal generating system and the display of the present invention will be described clearly and thoroughly hereinafter in combination with the drawings of the embodiments of the present invention.

The First Embodiment

Figure 1:
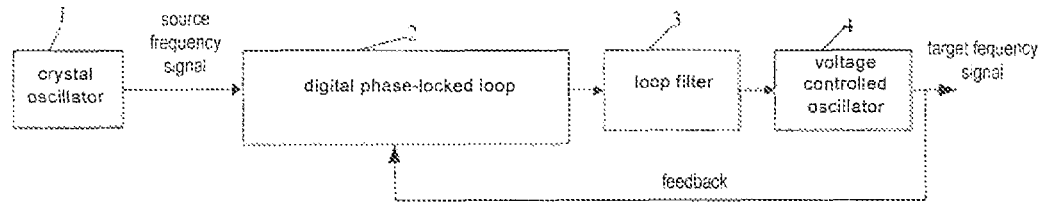
FIG. 1 is a circuit diagram of a frequency signal generating system according to the invention.

The embodiment provides a frequency signal generating system, as shown in FIG. 1, which comprises a crystal oscillator 1, a loop filter 3, and a voltage controlled oscillator 4. The crystal oscillator 1 is used to supply a source frequency signal, the voltage controlled oscillator 4 is used to output a target frequency signal, and the loop filter 3 is used to filter out high frequency components of a signal. The frequency signal generating system further comprises a digital phase-locked loop 2, wherein the crystal oscillator 1, the digital phase-locked loop 2, the loop filter 3, and the voltage controlled oscillator 4 are connected sequentially, and the output terminal of the voltage controlled oscillator 4 is connected to the first input terminal of the digital phase-locked loop 2 so as to feed the target frequency signal back to the digital phase-locked loop 2. The digital phase-locked loop 2 is used to perform frequency-dividing and phase-detecting on the source frequency signal and the fed back target frequency signal so that the target frequency signal output from the voltage controlled oscillator 4 and the source frequency signal may satisfy a definite mathematical relationship therebetween.

It should be noted that upon the definite mathematical relationship between the target frequency signal output from the voltage controlled oscillator 4 and the source frequency signal is satisfied, a desired target frequency signal may be obtained by setting the source frequency signal.

The crystal oscillator 1 is mainly used to supply the source frequency signal, but the invention is not limited thereto, the source frequency signal may be generated by using other clock signal generating devices.

Figure 2:
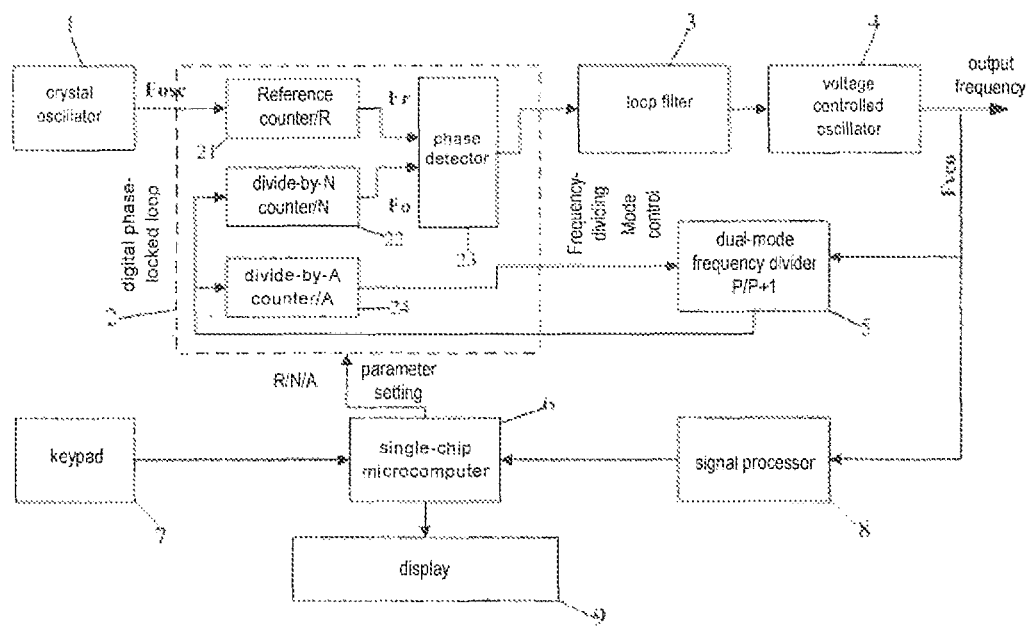
FIG. 2 is a circuit diagram of a frequency signal generating system in a first embodiment of the invention.

In the embodiment, as shown in FIG. 2, the frequency signal generating system may further comprises a frequency divider which is a dual-mode frequency divider 5. The frequency divider (i.e., the dual-mode frequency divider 5) is connected between the output terminal of the voltage controlled oscillator 4 and the first input terminal of the digital phase-locked loop 2 to perform frequency-dividing on the target frequency signal fed back from the voltage controlled oscillator 4, and supplies the frequency-divided signal to the digital phase-locked loop 2.

In the embodiment, the digital phase-locked loop 2 comprises a reference counter 21, a first frequency-dividing counter, a second frequency-dividing counter, and a phase detector 23. The first frequency-dividing counter is a divide-by-N counter 22 whose frequency division ratio is N, the second frequency-dividing counter is a divide-by-A counter 24 whose frequency division ratio is A. The input terminal of the reference counter 21 is connected to the output terminal of the crystal oscillator 1, the input terminal of the first frequency-dividing counter (i.e., the divide-by-N counter 22) is connected to the output terminal of the frequency divider (i.e., the dual-mode frequency divider 5), the output terminal of the reference counter 21 and the output terminal of the first frequency-dividing counter (i.e., the divide-by-N counter 22) are connected to the first input terminal and the second input terminal of the phase detector 23, respectively, and the output terminal of the phase detector 23 is connected to the input terminal of the loop filter 3. The input terminal of the second frequency-dividing counter (i.e., the divide-by-A counter 24) is connected to the output terminal of the frequency divider (i.e., the dual-mode frequency divider 5), the output terminal of the second frequency-dividing counter (i.e., the divide-by-A counter 24) is connected to the control input terminal of the frequency divider (i.e., the dual-mode frequency divider 5).

The reference counter 21 is used to perform frequency-dividing on the source frequency signal supplied from the crystal oscillator 1 and than outputs the frequency-divided signal to the phase detector 23.

The target frequency signal is firstly fed back to the frequency divider, the frequency divider performs frequency-dividing on the fed back target frequency signal and supplies the frequency-divided target frequency signal to the first frequency-dividing counter and the second frequency-dividing counter, the first frequency-dividing counter performs frequency-dividing on the frequency-divided target frequency signal again and output the resultant signal to the phase detector 23. The second frequency-dividing counter supplies a frequency-dividing control signal to the frequency divider so that the frequency divider may adopt various frequency-dividing modes, specific frequency-dividing modes will be described in detail in the description regarding the frequency divider.

The phase detector 23 receives the frequency-divided source frequency signal output from the reference counter 21 and the frequency-divided target frequency signal output from the first frequency-dividing counter, compares the frequency-divided source frequency signal and the frequency-divided target frequency signal so as to generate an error voltage signal, and outputs the error voltage signal to the loop filter 3. The error voltage signal is converted into a DC voltage signal after its high frequency components are filtered out by the loop filter 3, and the DC voltage signal is output to the voltage controlled oscillator 4, the voltage controlled oscillator 4 outputs a target frequency signal based on the DC voltage signal.

The digital phase-locked loop is used such that it is easy to be connected, frequency signals may be generated in a precisely controllable manner, and signals with various target frequencies may be generated to meet different requirements, the target frequency may be higher than the source frequency, the same as the source frequency but with more stable performance, or lower than the source frequency.

In the embodiment, the dual-mode frequency divider 5 is adopted as the frequency divider, the frequency division ratio of the dual-mode frequency divider 5 is $P/(P+1)$ the first frequency-dividing counter is a divide-by-N counter 22 whose frequency division ratio is N, the second frequency-dividing counter is a divide-by-A counter 24 whose frequency division ratio is A. That is, the dual-mode frequency divider 5 has two operation modes (frequency-dividing modes), one is a mode of frequency-dividing by P (i.e., with a frequency division ratio being P) and the other is a mode of frequency-dividing by (P+1) (i.e., with a frequency division ratio being P+1), a specific mode is specified through a mode control signal input from the control input terminal of the dual-mode frequency divider 5, the mode control signal is output from the output terminal of the divide-by-A counter, and the level of the mode control signal is a high level "1" or a low level "0". When a low level "0" is input into the control input terminal, the dual-mode frequency divider 5 has a frequency division ratio of P; and when a high level "1" is input into the control input terminal, the dual-mode frequency divider 5 has a frequency division ratio of P+1. The frequency division ratio P/(P+1) of the dual-mode frequency divider 5 is typically 32/33, 64/65 or 128/129.

In the embodiment, the total frequency division ratio of the dual-mode frequency divider 5, the divide-by-N counter 22 and the divide-by-A counter 24 is NT=P×N+A, wherein P represents the frequency division ratio of the frequency divider. A represents the frequency division ratio of the first frequency-dividing counter, and N represents the frequency division ratio of the second frequency-dividing counter. The definite mathematical relationship between the target frequency signal and the source frequency signal is: Fvco=[(P+A]Fosc/R, wherein Fvco represents the frequency of the target frequency signal, Fosc represents the frequency of the source frequency signal, and R represents the frequency division ratio of the reference counter 21.

The dual-mode frequency divider 5 is used such that the entire frequency signal generating system may be more accurately controlled, and the dual-mode frequency divider 5 may cooperate with the digital phase-locked loop 2 so that the frequency signal generating system may generate a variety of target frequency signals.

In the embodiment, the loop filter 3 receives the error voltage signal output from the phase detector 23, and filters out the high frequency components of the error voltage signal so as to convert the error voltage signal into a DC voltage signal, and the loop filter 3 outputs the DC voltage signal to the voltage controlled oscillator 4.

In the embodiment, the voltage controlled oscillator 4 comprises a voltage-capacitance conversion device for converting the received DC voltage signal into a target frequency signal and outputting it. The voltage controlled oscillator 4 is shown in FIG. 3, and the operation principle of the voltage controlled oscillator 4 is as follows: the voltage-capacitance conversion device of the voltage controlled oscillator 4 converts the received DC voltage signal into a target frequency signal and outputs it, and the voltage controlled oscillator 4 converts based on the following equation:

$$f_0 = \frac{1}{2\pi\sqrt{L_1(C_5 + C_D)}} \quad (1)$$

Figure 3:
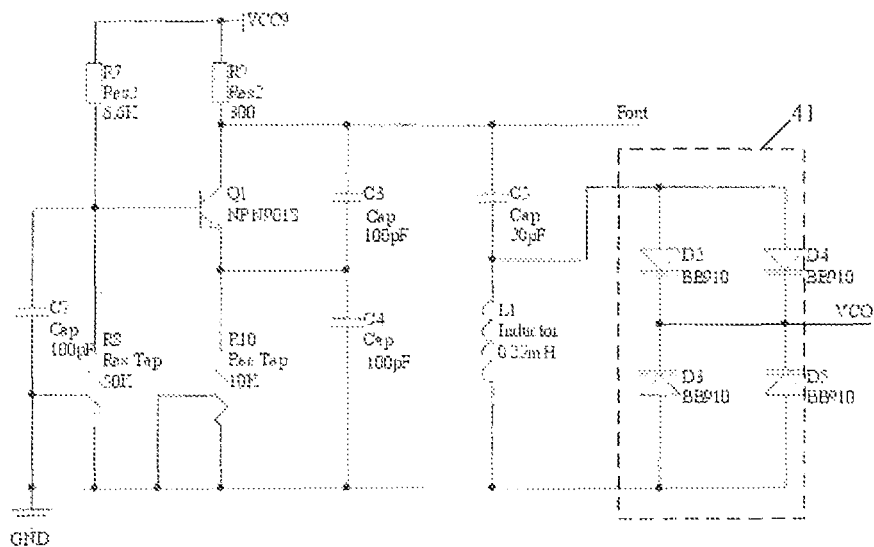
FIG. 3 is a circuit diagram of an example of a voltage controlled oscillator in the first embodiment of the invention.
Figure 4:
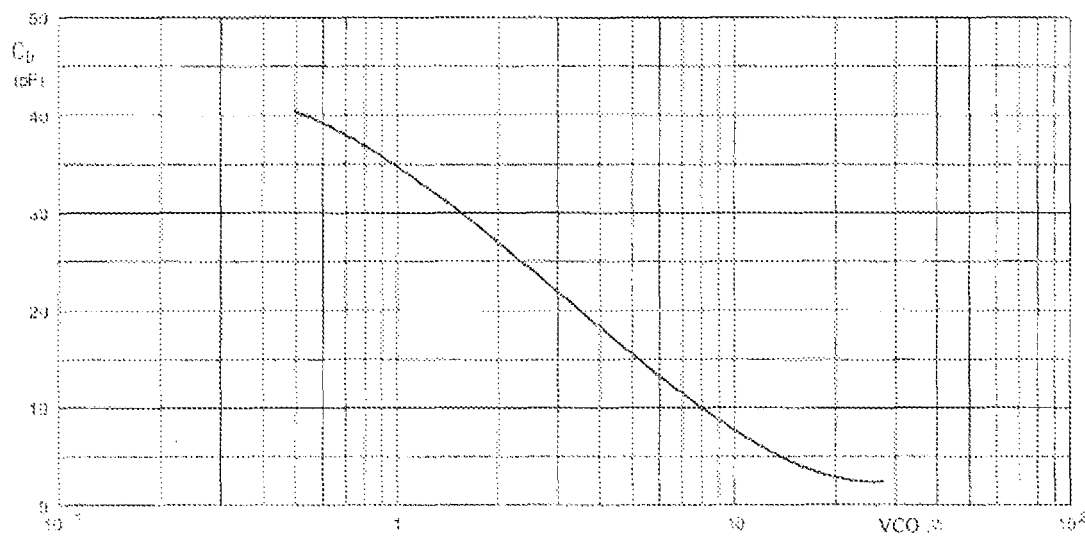
FIG. 4 is a voltage-capacitance transformation curve of a varactor circuit in the voltage controlled oscillator in FIG. 3.

In the equation (1), $f_0$ represents the frequency of the target frequency signal, and $C_D$ represents the equivalent capacitance of the voltage-capacitance conversion device, in the embodiment, as the voltage-capacitance conversion device, a varactor BB910 is used, a circuit 41 composed of four varactors BB910 in the dotted line block in FIG. 3 is equivalent to the $C_D$ in the equation (1), and based on the voltage-capacitance conversion characteristic curve of the circuit 41 as shown in FIG. 4, a value of the capacitance $C_D$ corresponding to the DC voltage signal received from the voltage controlled oscillator 4 may be found. In addition, in the voltage controlled oscillator 4, the values of $L_1$ and $C_5$ are known (in the embodiment shown in FIG. 3, $L_1$ is 0.25 mH, and $C_5$ is 20 pF), thus the value of the frequency $f_0$ of the target frequency signal may be calculated.

It should be noted that, according to the above operation principle of the voltage controlled oscillator 4, as the DC voltage signal may be supplied to the voltage controlled oscillator 4 until the digital phase-locked loop 2 and the frequency divider perform frequency-dividing and phase-detecting as well as subsequent filtering process on the source frequency signal and the target frequency signal, so in order to finally obtain the target frequency signal, the DC voltage signal must be a signal that can be converted by the voltage controlled oscillator 4, that is, the DC voltage signal must be in the range of voltage-capacitance conversion characteristic curve of the circuit 41 composed of varactors, it can be determined that the values of N, A and R can not be arbitrarily preset, in contrast, the values of N, A and R must be preset such that the DC voltage signal converted from the error voltage signal output from the phase detector 23 after being filtered can be converted by the voltage controlled oscillator 4, thus the generation of the desired target signal may be ensured. Therefore, generally, the reference counter 21 is a 14-bit programmable counter, the frequency division ratio R of which may be preset in a range from 6 to 16383; the divide-by-N counter 22 is a 11-bit programmable counter, the frequency division ratio N of which may be preset in a range from 16 to 2047; the divide-by-A counter 24 is a 7-bit programmable counter, the frequency division ratio A of which may be preset in a range from 0 to 127.

Figure 5:
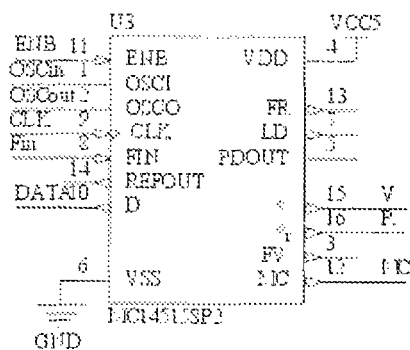
FIG. 5 is a diagram showing pins of a digital phase-locked loop chip in the first embodiment.
Figure 6:
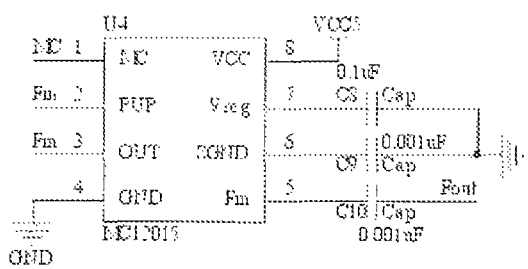
FIG. 6 is a diagram showing pins of a dual-mode frequency divider chip in the first embodiment.
Figure 7:
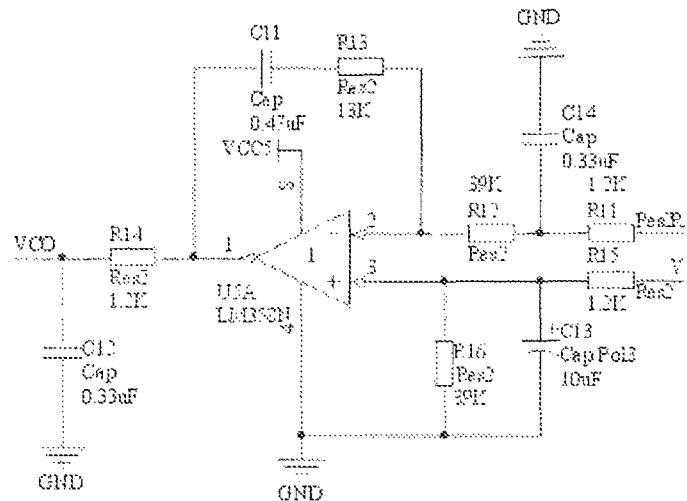
FIG. 7 is a circuit diagram of an example of a loop filter in the first embodiment.

In the embodiment, as shown in FIG. 5, as the digital phase-locked loop 2, the monolithic frequency synthesis chip MC145158-2 produced by MOTOROLA, INC. may be adopted. The frequency divider is a digital dual-mode frequency divider, which may be the monolithic integrated frequency synthesis chip, as shown in FIG. 6, as the dual-mode frequency divider 5, the chip MC12015 produced by MOTOROLA, INC. may be adopted. The loop filter 3 is an analog low-pass filter, as shown in FIG. 7, the circuit for the loop filter 3 refers to the typical application circuit of MC145158-2. In addition, the crystal oscillator 1, the voltage controlled oscillator 4 and the loop filter 3 adopt analog circuits, thus the cost of the entire frequency signal generating system is reduced.

Regarding the connections, as shown in FIGS. 5, 6 and 7, Pins 1 and 2 of the digital phase-locked loop chip MC145158-2 are connected to the output terminal of the crystal oscillator 1. Pins 8 and 10 of the digital phase-locked loop chip MC145158-2 are connected to the digital parameter output terminal of a single-chip computer 6, Pins 15 and 16 of the digital phase-locked loop chip MC145158-2 are connected to the input terminals "V" and "R" of the circuit for the loop filter 3 respectively, Pin 12 of the digital phase-locked loop chip MC145158-2 is connected to Pin 1 of the dual modulus prescaler chip MC12015, and Pin 8 of the digital phase-locked loop chip MC145158-2 is connected to Pin 3 of the dual modulus prescaler chip MC12015. In addition, the output terminal "VCO" of the loop filter 3 is connected to the input terminal "VCO" of the voltage controlled oscillator, the output terminal "Fout" of the voltage controlled oscillator is connected to Pin 5 of the dual modulus prescaler chip MC12015. Thus, the functions of the system can be achieved.

In addition, to perform human-computer interaction well, the frequency signal generating system of the invention further comprises a human-computer interface including the single-chip microcomputer 6, the human-computer interface further includes a keypad 7 which is connected to the digital parameter input terminal of the single-chip microcomputer 6, the digital parameter input terminal of the single-chip microcomputer 6 is connected to the third input terminal of the digital phase-locked loop 2, and the frequency-dividing parameter values for the reference counter 21 the first frequency-dividing counter and the second frequency-dividing counter in the digital phase-looked loop 2 may be preset through the keypad 7.

In the embodiment, the human-computer interface further includes a signal processor 8 and a display 9, the input terminal of the signal processor 8 is connected to the output terminal of the voltage controlled oscillator 4, the output terminal of the signal processor 8 is connected to the frequency input terminal of the single-chip microcomputer 6, the display 9 is connected to the display data output terminal of the single-chip microcomputer 6, and the signal processor 8 is used to process the target frequency signal so that the display displays the value of the target frequency.

The human-computer interface is provided such that the user can easily monitor and control the frequency signal generating system in real time. Of course, if it is unnecessary to artificially monitor in real time, the human-computer interface may be provide without the signal processor and the display, which will not affect the operation of the entire frequency signal generating system.

In the embodiment, the frequency signal generating system operates as follows: the crystal oscillator 1 supplies a base source frequency signal, in order to convert the source frequency signal into a desired target frequency signal, the source frequency signal is subjected to the frequency-dividing, phase-detecting and filtering and converting process in the dual-mode frequency divider 5, the digital phase-locked loop 2, the loop filter 3 and the voltage controlled oscillator 4 respectively, to finally obtain the desired target frequency signal.

The finally obtained desired target frequency signal is accurately controllable. The accurate control is realized mainly through the digital phase-locked loop 2 and the dual-mode frequency divider 5, and the specific control procedure is as follows: the reference counter 21, the divide-by-N counter 22 and the divide-by-A counter 24 are all programmable frequency-dividing counters, and the respective frequency division ratios R, N and A thereof may be artificially preset to be different frequency-dividing parameter values through the keypad 7 and the single-chip microcomputer 6, wherein N>A. Two input signals of the phase detector 23 are Fr and Fo respectively, wherein Fr=Fosc/(the total frequency division ratio for frequency-dividing the Fosc), and Fo=Fvco/(the total frequency division ratio for frequency-dividing the Fvco). The output of the dual-mode frequency divider 5 may simultaneously drive the divide-by-N counter 22 and the divide-by-A counter 24, and after being driven, the divide-by-N counter 22 and the divide-by-A counter 24 count down from the preset N value and A value respectively.

When the count value of the divide-by-N counter 22 does not reach 0, the mode control signal is at a high level, that is, a high level "1" is input into the control input terminal, the output frequency of the dual-mode frequency divider 5 is Fvco/(P+1). After the high level "1' has been input for A×(P+1) periods, the count value of the divide-by-A counter 24 reaches 0, the mode control signal becomes to be at a low level, at this time the count value of the divide-by-N counter 22 is N−A, therefore, N>A must be satisfied. Thus, under the control of the mode control signal being at a low level, that is, the low level "0" is input into the control input terminal, the output frequency of the dual-mode frequency divider 5 is Fvco/P. After a further (N−A)×P periods, the count value of the divide-by-N counter 22 also reaches 0, at this time, preset values N and A are reassigned to the divide-by-N counter 22 and the divide-by-A counter 24, and at the same time, the phase detector 23 outputs a phase-comparison pulse (that is, an error voltage signal), and restores the mode control signal to be at a high level.

In one whole cycle, the input number of periods (that is, the total frequency division ratio) is:

$$NT=A\times(P+1)+(N-A)\times P=P\times N+A \qquad (2)$$

therefore, $$Fo=Fvco/NT=Fvco/[(P\times N)+A] \qquad (3)$$

$$Fr=Fosc/R \qquad (4)$$

when the phase is locked, $$Fo=Fr \qquad (5)$$

thus it can be deduced that $$Fvco=[(P\times N)+A]Fosc/R \qquad (6)$$

During the frequency-dividing and phase-detecting process, the single-chip microcomputer 6 controls the magnitude of the frequency of the target frequency signal (that is, output frequency) by setting the values of N, A and R, and thereby obtains a desired target frequency signal which is accurately controllable, wherein the frequency of the target frequency signal is Fvco, the definite mathematical relationship between the target frequency signal and the source frequency signal is Fvco=[(P×N)+A]Fosc/R.

During the above process, the phase-comparison pulse output from the phase detector 23 is actually an error voltage signal, the loop filter 3 filters out the high frequency components mixed in the error voltage signal therefrom, and converts the error voltage signal into a DC voltage signal. The voltage controlled oscillator 4 outputs the target frequency signal under the control of the DC voltage signal. Then, a next cycle of feedback and frequency-dividing and phase detecting starts, and during this process, the preset values of N, A and R are adjusted continuously until the desired target frequency signal is finally obtained.

In the embodiment, the circuits of the entire frequency signal generating system are connected to configure a closed-loop system, and the dual-mode frequency divider 5 constitutes the negative feedback circuit of the closed-loop system, such that a definite mathematical relationship between the target frequency signal and the source frequency signal may be satisfied.

The Second Embodiment

Figure 8:
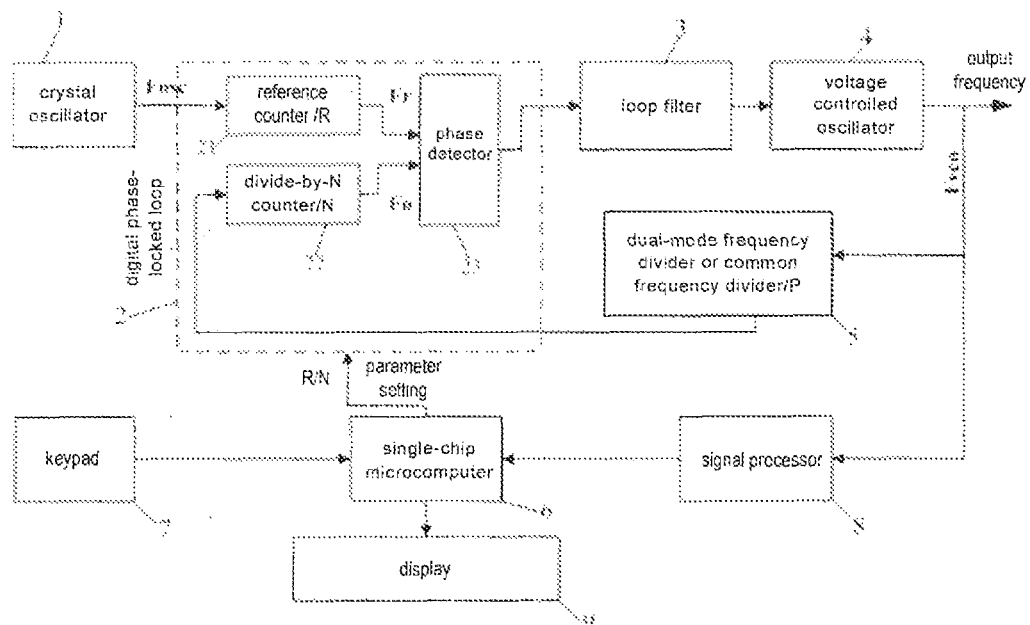
FIG. 8 is a circuit diagram of a frequency signal generating system in the second embodiment of the invention.

The embodiment provides a frequency signal generating system, as shown in FIG. 8, different from the first embodiment, the dual-mode frequency divider 5 of this frequency signal generating system only operates in one frequency-dividing mode, that is, a mode of divide-by-P. In this case, it is unnecessary to input the mode control signal into the control input terminal of the dual-mode frequency divider 5, accordingly, the digital phase-locked loop 2 can be provided without the divide-by-A counter.

Therefore, in the embodiment, the digital phase-locked loop 2 comprises a reference counter 21, a divide-by-N counter 22, and a phase detector 23.

The input terminal of the reference counter 21 is connected to the output terminal of the crystal oscillator 1, the input terminal of the divide-by-N counter 22 is connected to the output terminal of the dual-mode frequency divider 5, the output terminal of the reference counter 21 and the output terminal of the divide-by-N, counter 22 are connected to the first input terminal and the second terminal of the phase detector 23, respectively, and the output terminal of the phase detector 23 is connected to the input terminal of the loop filter 3.

The dual-mode frequency divider 5 is used to perform frequency-dividing on the fed back target frequency signal, and supplies the frequency-divided target frequency signal to the divide-by-N counter 22, the frequency-divided target frequency signal is frequency-divided by the divide-by-N counter 22 again and output to the phase detector 23.

In the above case, the total frequency division ratio of the dual-mode frequency divider 5 and the divide-by-N counter 22 is NT=P×N, the definite mathematical relationship between the target frequency signal and the source frequency signal is: Fvco=[(P×N)]Fosc/R, Fosc/R, wherein Fvco represents the frequency of the target frequency signal, Fosc represents the frequency of the source frequency signal, and R represents the frequency division ratio of the reference counter 21.

It should be noted that the dual-mode frequency divider 5 in the embodiment can be replaced with a common digital frequency divider, and the connections of the common digital frequency divider are the same as those of the above dual-mode frequency divider, which can realize the functions of the frequency signal generating system.

Accordingly, in the embodiment, the dual-mode frequency divider 5 (or the common digital frequency divider) and the digital phase-locked loop 2 operate as follows:

The dual-mode frequency divider 5 operates in one operation mode (frequency-dividing mode), that is, a mode of divide-by-P. The frequency of the target frequency signal output from the voltage controlled oscillator 4 is Fvco, and the frequency of the source frequency signal output from the crystal oscillator 1 is Faso. Both the reference counter 21 and the divide-by-N counter 22 are programmable frequency-dividing counters, and the respective frequency division ratios R and N thereof may be preset to be different frequency-dividing parameter values through the keypad 7 and the single-chip microcomputer 6. Two input signals of the phase detector 23 are Fr and Fo respectively, wherein Fr=Fosc/(the total frequency division ratio for frequency-dividing the Fosc), and Fo=Fvco/(the total frequency division ratio for frequency-dividing the Fvco). The frequency division ratio of the dual-mode frequency divider 5 is 32, 64 or 128. The output of the dual-mode frequency divider 5 can drive the divide-by-N counter 22, and after being driven, the divide-by-N counter 22 counts down from the preset N value.

During the divide-by-N counter 22 counts, the output frequency of the dual-mode frequency divider 5 is Fvco/P. After N×P periods, the count value of the divide-by-N counter 22 reaches 0, at this time, a preset value N is reassigned to the divide-by-N counter 22, and at the same time, the phase detector 23 outputs a phase-comparison pulse (that is, an error voltage signal).

In one whole cycle, the input number of periods (that is, the total frequency division ratio) is:

$$NT=P\times N \quad (7)$$

therefore, $$Fo=Fvco/(P\times N) \quad (8)$$

$$Fr=Fosc/R \quad (9)$$

when the phase is locked, $$Fo=Fr \quad (10)$$

thus it can be deduced that $$Fvco=(P\times N)Fosc/R \quad (11)$$

During the frequency-dividing and phase-detecting process, the single-chip microcomputer 6 controls the magnitude of the frequency of the target frequency signal (that is, output frequency) by setting the values of M and R, and thereby obtains a desired target frequency signal, wherein the frequency of the target frequency signal is Fvco, and the definite mathematical relationship between the target frequency signal and the source frequency signal is Fvco=(P×N)Fosc/R.

Other circuits, electrical connections and operations in the embodiment are the same as those in the first embodiment, and description thereof will be omitted.

Beneficial effects of the first and second embodiments are as follows: the frequency signal generating systems in the first and second embodiments are closed-loop systems composed of analog circuits (including the crystal oscillator, the loop filter, and the voltage controlled oscillator) and digital circuits (including the digital phase-locked loop, the digital frequency divider, the keypad and the single-chip microcomputer). The frequency signal generating systems can generate a variety of target frequency signals which can be accurately controlled, and the stabilities of the frequency signal generating systems are improved through the negative feedback circuit composed of the digital frequency divider; the keypad and the display constitute a human-computer interface under the control of the single-chip microcomputer such that it is easy to monitor the control; the combination of the analog circuits and the digital circuits largely reduces the cost of the frequency signal generating system.

The Third Embodiment

Figure 9:
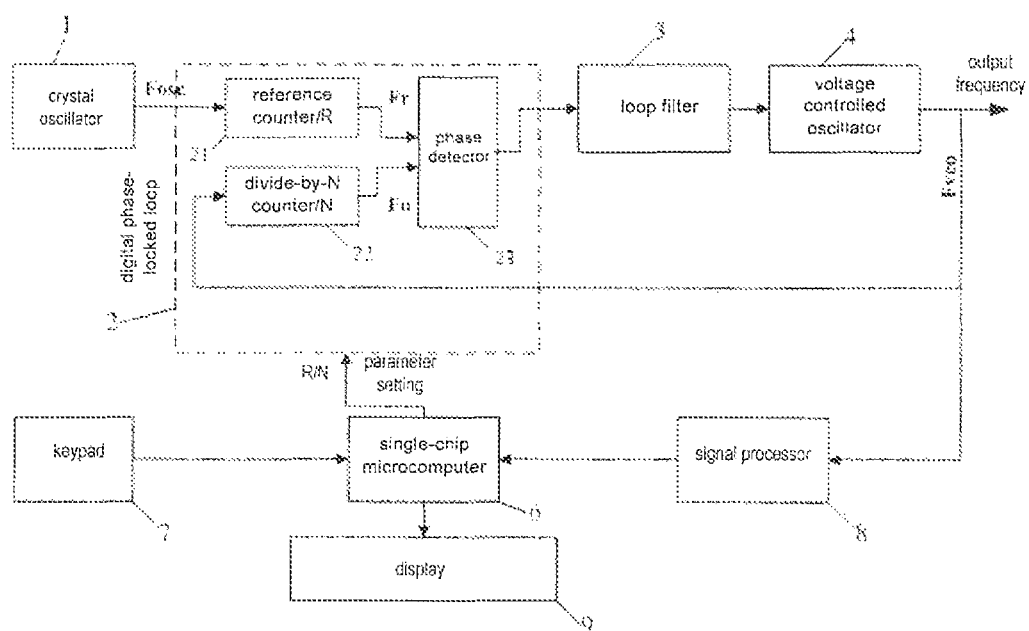
FIG. 9 is a circuit diagram of a frequency signal generating system in the third embodiment of the invention.

The embodiment provides a frequency signal generating system, as shown in FIG. 9, different from the first and second embodiments, this frequency signal generating system is not provided with the frequency divider, that is, the target frequency signal output from the voltage controlled oscillator 4 in the frequency signal generating system is directly fed back to the digital phase-locked loop 2.

Therefore, in the embodiment, the digital phase-locked loop 2 comprises a reference counter 21, a first frequency-dividing counter, and a phase detector 23.

The input terminal of the reference counter 21 is connected to the output terminal of the crystal oscillator 1, the input terminal of the first frequency-dividing counter is connected to the output terminal of the voltage controlled oscillator 4, the output terminal of the reference counter 21 and the output terminal of the first frequency-dividing counter are connected to the first input terminal and the second terminal of the phase detector 23, respectively, and the output terminal of the phase detector 23 is connected to the input terminal of the loop filter 3.

The reference counter 21 is used to perform frequency-dividing on the source frequency signal supplied from the crystal oscillator 1 and outputs the frequency-divided source frequency signal to the phase detector 23.

The first frequency-dividing counter is used to perform frequency-dividing on the target frequency signal and outputs the frequency-divided target frequency signal to the phase detector 23.

The phase detector 23 compares the frequency-divided source frequency signal and the frequency-divided target frequency signal so as to generate an error voltage signal, and outputs the error voltage signal to the loop filter 3. The error voltage signal is converted into a DC voltage signal after its high frequency components are filtered out by the loop filter 3, the DC voltage signal is output to the voltage controlled oscillator 4, and the voltage controlled oscillator 4 outputs a target frequency signal based on the DC voltage signal.

In this embodiment, the first frequency-dividing counter is a divide-by-N counter 22 whose frequency division ratio is N, and the definite mathematical relationship between the target frequency signal and the source frequency signal is: Fvco=NFosc/R, wherein Fvco represents the frequency of the target frequency signal, Fosc represents the frequency of the source frequency signal, and R represents the frequency division ratio of the reference counter 21.

Accordingly, in the embodiment, the digital phase-locked loop 2 operates as follows:

The frequency of the target frequency signal output from the voltage controlled oscillator 4 is Fvco, and the frequency of the source frequency signal output from the crystal oscillator 1 is Fosc. Both the reference counter 21 and the divide-by-N counter 22 are programmable frequency-dividing counters, the respective frequency division ratios R and N thereof may be artificially preset to be different frequency-dividing parameter values through the keypad 7 and the single-chip microcomputer 6. Two input signals of the phase detector 23 are Fr and Fo respectively, wherein Fr=Fosc/(the total frequency division ratio for frequency-dividing the Fosc), and Fo=Fvco/(the total frequency division ratio for frequency-dividing the Fvco). The output of the voltage controlled oscillator 4 can drive the divide-by-N counter 22, and after being driven, the divide-by-N counter 22 counts down from the preset N value.

During the divide-by-N counter 22 counts, the output frequency of the voltage controlled oscillator 4 is Fvco/N. After N periods, the count value of the divide-by-N counter 22 reaches 0, at this time, a preset value N is reassigned to the divide-by-N counter 22, and at the same time, the phase detector 23 outputs a phase-comparison pulse (that is, an error voltage signal).

In one whole cycle, the input number of periods (that is, the total frequency division ratio) is N:
therefore $$Fo=Fvco/N \quad (12)$$

$$Fr=Fosc/R \quad (13)$$

when the phase is locked, $$Fo=Fr \quad (14)$$

thus it can be deduced that $$Fvco=NFosc/R \quad (15)$$

During the frequency-dividing and phase-detecting process, the single-chip microcomputer 6 controls the magnitude of the frequency of the target frequency signal (that is, output frequency) by setting the values of N and R, and thereby obtains a desired target frequency signal, wherein the frequency of the target frequency signal is Fvco, and the definite mathematical relationship between the target frequency signal and the source frequency signal is Fvco=NFosc/R.

Other circuits, electrical connections and operations in the embodiment are the same as those in the first or second embodiment, and description thereof will be omitted.

Beneficial effects of the third embodiment are as follows: the frequency signal generating system in the third embodiment is a closed-loop system composed of analog circuits (such as the crystal oscillator, the loop filter, and the voltage controlled oscillator) and digital circuits (such as the digital phase-locked loop, the keypad and the single-chip microcomputer). The frequency signal generating system can generate a variety of target frequency signals which can be accurately controlled, and the stability of the frequency signal generating system is improved through the negative feedback circuit; the keypad and the display constitute a human-computer interface under the control of the single-chip microcomputer such that it is easy to monitor the control; the combination of the analog circuits and the digital circuits largely reduces the cost of the frequency signal generating system.

The Fourth Embodiment

The embodiment provides a display device including the frequency signal generating system according to any one of the first to third embodiments.

In the display device, the target frequency signal generated by the frequency signal generating system acts as the carrier frequency signal used when the display device is displaying. The data and control signal of the display device are input into the display device after being modulated into the target frequency signal, and then demodulated back to the original data and control signal so as to be displayed.

As the display device in this embodiment adopts the frequency signal generating system according to any one of the first to third embodiments, thus a carrier frequency signal, which can be accurately controlled, can be obtained, and the cost of the display device is reduced.

Beneficial effects of the invention are as follows: the frequency signal generating system in the third embodiment is a closed-loop system composed of analog circuits and digital circuits. The frequency signal generating system can generate a variety of target frequency signals which can be accurately controlled, and the stability of the frequency signal generating system is improved through the negative feedback circuit; the keypad and the display constitute a human-computer interface under the control of the single-chip microcomputer such that it is easy to monitor the control; the combination of the analog circuits and the digital circuits largely reduces the cost of the frequency signal generating system. As the display device in this embodiment adopts the frequency signal generating system, thus a carrier frequency signal, which can be accurately controlled, can be obtained, and the cost of the display device is reduced.

It should be understood that the embodiments above are just exemplary embodiments of the present invention to describe the principle of the present invention, and the present invention is not limited thereto. Any person skilled in the art can make various changes and substitutions without departing from the spirit and substance of the present invention, which should be considered to be within the protection scope of the present invention.

What is claimed is:
1. A frequency signal generating system comprising:
   a digital phase-locked loop for receiving a source frequency signal;
   a loop filter, an input terminal of which is connected to an output terminal of the digital phase-locked loop, for filtering out high frequency components of a signal output from the digital phase-locked loop;

a voltage controlled oscillator, an input terminal of which is connected to an output terminal of the loop filter, for outputting a target frequency signal according to a signal from the loop filter, wherein, an output terminal of the voltage controlled oscillator is connected to a first input terminal of the digital phase-locked loop so that the target frequency signal output from the voltage controlled oscillator is fed back to the digital phase-locked loop, the digital phase-locked loop performs frequency-dividing and phase-detecting on the source frequency signal and the fed back target frequency signal so that the target frequency signal output from the voltage controlled oscillator and the source frequency signal satisfy a definite mathematical relationship therebetween, and a frequency divider connected between the output terminal of the voltage controlled oscillator and the first input terminal of the digital phase-locked loop, for performing frequency-dividing on the fed back target frequency signal and supplying the frequency-divided target frequency signal to the digital phase-locked loop, wherein the frequency divider is a digital frequency divider, the digital frequency divider is configured by a monolithic integrated frequency synthesizer chip, and the loop filter is an analog low-pass filter.

2. The frequency signal generating system according to claim 1, further comprising a crystal oscillator, an output terminal of which is connected to a second input terminal of the digital phase-locked loop, for outputting the source frequency signal.

3. The frequency signal generating system according to claim 1, wherein the digital phase-locked loop comprises a reference counter, a first frequency-dividing counter and a phase detector, an input terminal of the reference counter receives the source frequency signal, an input terminal of the first frequency-dividing counter is connected to an output terminal of the frequency divider, an output terminal of the reference counter is connected to a first input terminal of the phase detector, and an output terminal of the first frequency-dividing counter is connected to a second input terminal of the phase detector an output terminal of the phase detector is connected to the input terminal of the loop filter;

the reference counter performs frequency-dividing on the source frequency signal and outputs the frequency-divided source frequency signal to the phase detector;

the frequency-divided target frequency signal received from the frequency divider is frequency-divided again by the first frequency-dividing counter and output to the phase detector;

the phase detector compares the frequency-divided source frequency signal and the frequency-divided target frequency signal, generates an error voltage signal, and outputs the error voltage signal to the loop filter, the error voltage signal is converted into a DC voltage signal after its high frequency components are filtered out by the loop filter, the DC voltage signal is output to the voltage controlled oscillator, and the voltage controlled oscillator outputs the target frequency signal according to the DC voltage signal.

4. The frequency signal generating system according to claim 3, wherein a frequency division ratio of the frequency divider is P, the first frequency-dividing counter comprises a divide-by-N counter whose frequency division ratio is N, and a total frequency division ratio of the frequency divider and the divide-by-N counter is NT=P×N; the definite mathematical relationship between the target frequency signal and the source frequency signal is: Fvco=[(P×N)]Fosc/R, wherein Fvco represents a frequency of the target frequency signal, Fosc represents a frequency of the source frequency signal, and R represents a frequency division ratio of the reference counter.

5. The frequency signal generating system according to claim 3, wherein the digital phase-locked loop further comprises a second frequency-dividing counter, an input terminal of the second frequency-dividing counter is connected to the output terminal of the frequency divider, an output terminal of the second frequency-dividing counter is connected to a control input terminal of the frequency divider, the second frequency-dividing counter supplies a frequency-dividing control signal to the frequency divider such that the frequency divider adopts different frequency-dividing modes according to the frequency-dividing control signal.

6. The frequency signal generating system according to claim 5, wherein the frequency divider is a dual-mode frequency divider, a frequency division ratio of the dual-mode frequency divider is P/P+1, the first frequency-dividing counter is a divide-by-N counter whose frequency division ratio is N, the second frequency-dividing counter is a divide-by-A counter whose frequency division ratio is A, a total frequency division ratio of the dual-mode frequency divider, the divide-by-N counter and the divide-by-A counter is NT=P×N+A; the definite mathematical relationship between the target frequency signal and the source frequency signal is: Fvco=[(P×N)+A]Fosc/R, wherein Fvco represents a frequency of the target frequency signal, Fosc represents a frequency of the source frequency signal, and R represents a frequency division ratio of the reference counter.

7. The frequency signal generating system according to claim 1, wherein the digital phase-locked loop comprises a reference counter, a first frequency-dividing counter and a phase detector, an input terminal of the reference counter receives the source frequency signal, an input terminal of the first frequency-dividing counter is connected to an output terminal of the voltage controlled oscillator, an output terminal of the reference counter in connected to a first input terminal of the phase detector, and an output terminal of the first frequency-dividing counter is connected to a second input terminal of the phase detector, an output terminal of the phase detector is connected to the input terminal of the loop filter;

the reference counter performs frequency-dividing on the source frequency signal and then outputs the frequency-divided source frequency signal to the phase detector;

the first frequency-dividing counter performs frequency-dividing on the target frequency signal and then outputs the frequency-divided target frequency signal to the phase detector;

the phase detector compares the frequency-divided source frequency signal and the frequency-divided target frequency signal, generates an error voltage signal, and outputs the error voltage signal to the loop filter, the error voltage signal is converted into a DC voltage signal after its high frequency components are filtered out by the loop filter, the DC voltage signal is output to the voltage controlled oscillator, and the voltage controlled oscillator outputs the target frequency signal according to the DC voltage signal.

8. The frequency signal generating system according to claim 7, wherein the first frequency-dividing counter is a divide-by-N counter whose frequency division ratio is N, and the definite mathematical relationship between the target frequency signal and the source frequency signal is: Fvco=NFosc/R, wherein Fvco represents a frequency of the target frequency signal, Fosc represents a frequency of the source frequency signal, and R represents a frequency division ratio of the reference counter.

9. The frequency signal generating system according to claim 3, wherein the voltage controlled oscillator comprises a voltage-capacitance conversion device for converting the DC voltage signal into the target frequency signal.

10. The frequency signal generating system according to claim 9, further comprising a human-computer interface including a single-chip microcomputer, wherein
the human-computer interface includes a keypad which is connected to a digital parameter input terminal of the single-chip microcomputer, a digital parameter output terminal of the single-chip microcomputer is connected to a third input terminal of the digital phase-locked loop, and frequency-dividing parameter values for the reference counter, the first frequency-dividing counter or the second frequency-dividing counter in the digital phase-locked loop are preset through the keypad; and/or
the human-computer interface further includes a signal processor and a display, an input terminal of the signal processor is connected to the output terminal of the voltage controlled oscillator, an output terminal of the signal processor is connected to a frequency input terminal of the single-chip microcomputer, the output terminal of the signal processor is connected to the frequency input terminal of the single-chip microcomputer, the display is connected to a display data output terminal of the single-chip microcomputer, and the signal processor is used to process the target frequency signal so that the display displays the target frequency.

11. A display device comprising the frequency signal generating system according to claim 1.

12. The frequency signal generating system according to claim 4, wherein the voltage controlled oscillator comprises a voltage-capacitance conversion device for converting the DC voltage signal into the target frequency signal.

13. The frequency signal generating system according to claim 5, wherein the voltage controlled oscillator comprises a voltage-capacitance conversion device for converting the DC voltage signal into the target frequency signal.

14. The frequency signal generating system according to claim 6, wherein the voltage controlled oscillator comprises a voltage-capacitance conversion device for converting the DC voltage signal into the target frequency signal.

15. The frequency signal generating system according to claim 1, wherein the voltage controlled oscillator comprises a voltage-capacitance conversion device for converting a DC voltage signal into the target frequency signal.

16. The frequency signal generating system according to claim 3, wherein the frequency divider is a digital frequency divider, the digital frequency divider is configured by a monolithic integrated frequency synthesizer chip, and the loop filter is an analog low-pass filter.

17. The frequency signal generating system according to claim 4, wherein the frequency divider is a digital frequency divider, the digital frequency divider is configured by a monolithic integrated frequency synthesizer chip, and the loop filter is an analog low-pass filter.

* * * * *